(12) United States Patent
Majkowski et al.

(10) Patent No.: US 10,454,474 B2
(45) Date of Patent: Oct. 22, 2019

(54) PROXIMITY SWITCH HAVING SENSOR WITH DECORATIVE METAL

(71) Applicant: Ford Global Technologies, LLC, Dearborn, MI (US)

(72) Inventors: Matthew Anthony Majkowski, Dearborn, MI (US); Satyanarayana Raju Vemulapati, Westland, MI (US); Wei Xu, Nanjing (CN); Steven J. Antilla, Brighton, MI (US); Akshay Kaasam Sudershan, Northville, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 15/598,773

(22) Filed: May 18, 2017

(65) Prior Publication Data

US 2018/0302088 A1    Oct. 18, 2018

Related U.S. Application Data

(60) Provisional application No. 62/486,483, filed on Apr. 18, 2017.

(51) Int. Cl.
*H03K 17/96* (2006.01)
*B60Q 3/80* (2017.01)
*B60Q 3/20* (2017.01)

(52) U.S. Cl.
CPC ............. *H03K 17/962* (2013.01); *B60Q 3/20* (2017.02); *B60Q 3/80* (2017.02); *H03K 2017/9602* (2013.01); *H03K 2217/960755* (2013.01)

(58) Field of Classification Search
CPC ......... H03K 17/962; H03K 2017/9602; H03K 2217/960755; B60Q 3/80; B60Q 3/20
See application file for complete search history.

(56) References Cited

U.S. PATENT DOCUMENTS

| 8,816,985 | B1 * | 8/2014 | Tate | G06F 3/041 345/173 |
| 8,859,922 | B1 * | 10/2014 | Sage | H03K 17/975 200/600 |
| 8,933,708 | B2 | 1/2015 | Buttolo et al. | |
| 9,333,698 | B2 | 5/2016 | DeVries et al. | |
| 9,641,172 | B2 | 5/2017 | Salter et al. | |
| 2006/0245200 | A1 * | 11/2006 | Kuwana | B60Q 3/82 362/488 |
| 2010/0259282 | A1 * | 10/2010 | Niwa | H03K 17/9505 324/655 |

(Continued)

OTHER PUBLICATIONS

"Touch Sensors Design Guide," by Atmel, 10620 D-AT42-04/09, Revised Apr. 2009, 72 pages, Copyrighted 2008-2009 Atmel Corporation.

*Primary Examiner* — Amine Benlagsir
(74) *Attorney, Agent, or Firm* — Vichit Chea; Price Heneveld LLP (57) ABSTRACT

A proximity switch assembly is provided having a sensing pad and a proximity sensor extending around the sensing pad for generating an activation field. The proximity sensor comprises at least one electrode that forms a decorative trim component that is visibly exposed. The proximity switch assembly also includes a controller for determining activation of the switch based on a signal generated from the activation field.

13 Claims, 9 Drawing Sheets

(56) References Cited

U.S. PATENT DOCUMENTS

| | | | |
|---|---|---|---|
| 2013/0027349 A1* | 1/2013 | Sanatarossa | H03K 17/955 345/174 |
| 2015/0001060 A1* | 1/2015 | Kim | G06F 3/044 200/600 |
| 2015/0062941 A1* | 3/2015 | Sura | B60Q 3/82 362/488 |
| 2017/0192552 A1* | 7/2017 | Graf | G06F 3/044 |

* cited by examiner

PROXIMITY SWITCH HAVING SENSOR WITH DECORATIVE METAL

CROSS-REFERENCE TO RELATED APPLICATION

This application claims benefit to U.S. Provisional Patent Application No. 62/486,483, entitled "PROXIMITY SWITCH HAVING SENSOR WITH DECORATIVE METAL," filed on Apr. 18, 2017, the entire disclosure of which is hereby incorporated herein by reference.

FIELD OF THE INVENTION

The present invention generally relates to proximity switches, and more particularly relates to a proximity switch having sensor circuitry that integrates a visible decorative metal.

BACKGROUND OF THE INVENTION

Proximity switches, such as capacitive switches, have been employed for use on vehicles for operating devices such as interior map and dome lighting, moonroofs, and various other devices. Capacitive switches typically employ one or more capacitive sensors to generate a sense activation field and sense changes to the activation field indicative of user actuation of the switch, typically caused by a user's finger in close proximity or contact with the sensor. Capacitive switches are typically configured to detect user actuation of the switch based on comparison of a sensed activation field to a threshold. The capacitive switches are typically configured to include one or more electrodes configured with electrical circuitry formed onto a substrate. It would be desirable to provide for a proximity switch that provides a decorative look and allows reduced components for assembly.

SUMMARY OF THE INVENTION

According to one aspect of the present invention, a proximity switch assembly is provided. The proximity switch assembly includes a sensing pad, and a proximity sensor proximate the sensing pad for generating an activation field, wherein the proximity sensor comprises at least one electrode that forms a decorative trim component.

Embodiments of the first aspect of the invention can include any one or a combination of the following features:
  a controller for determining activation of the switch based on a signal generated from the activation field;
  the proximity sensor comprises a capacitive sensor;
  the proximity sensor comprises a first electrode comprising a first plurality of electrode fingers and a second electrode comprising a second plurality of electrode fingers, wherein the first and second electrode fingers are interdigitated and electrically coupled to generate the activation field;
  the second electrode surrounds the first electrode;
  an opaque portion covering a portion of the at least one electrode so as to expose a portion of the decorative trim component;
  the proximity switch is employed on a vehicle;
  the proximity switch is provided on a vehicle lamp;
  the sensing pad comprises a lens;
  the proximity sensor comprises chrome; and
  the chrome forms an electrical circuit for transmitting signals for the sensor.

According to another aspect of the present invention, a proximity switch assembly is provided. The proximity switch assembly includes a sensing pad, and a capacitive sensor extending around the sensing pad for generating an activation field. The capacitive sensor comprises at least one electrode that also forms a decorative trim component. The proximity switch assembly also includes an opaque layer covering only a portion of the capacitive sensor, and a controller for determining activation of the switch based on a signal generated from the activation field.

Embodiments of the second aspect of the invention can include any one or a combination of the following features:
  the capacitive sensor comprises a first electrode comprising a first plurality of electrode fingers and a second electrode comprising a second plurality of electrode fingers, wherein the first and second electrode fingers are interdigitated and electrically coupled to generate the activation field;
  the second electrode substantially surrounds the first electrode;
  an opaque portion covering a portion of the at least one electrode so as to expose a portion of the decorative trim component;
  the proximity switch is employed on a vehicle;
  the proximity switch is provided on a vehicle lamp;
  the proximity sensor comprises chrome; and
  the chrome forms an electrical circuit for transmitting signals for the sensor.

According to a further aspect of the present invention, a vehicle proximity switch assembly is provided. The proximity switch assembly includes a sensing pad, and a capacitive sensor extending around the sensing pad for generating an activation field. The capacitive sensor comprises at least one electrode that also forms a decorative trim component. The proximity switch assembly also includes an opaque layer covering only a portion of the capacitive sensor so as to expose the trim component, and a controller for determining activation of the switch based on a signal generated from the activation field.

These and other aspects, objects, and features of the present invention will be understood and appreciated by those skilled in the art upon studying the following specification, claims, and appended drawings.

DETAILED DESCRIPTION OF THE PREFERRED EMBODIMENTS

As required, detailed embodiments of the present invention are disclosed herein; however, it is to be understood that the disclosed embodiments are merely exemplary of the invention that may be embodied in various and alternative forms. The figures are not necessarily to a detailed design; some schematics may be exaggerated or minimized to show function overview. Therefore, specific structural and functional details disclosed herein are not to be interpreted as limiting, but merely as a representative basis for teaching one skilled in the art to variously employ the present invention.

Figure 1:
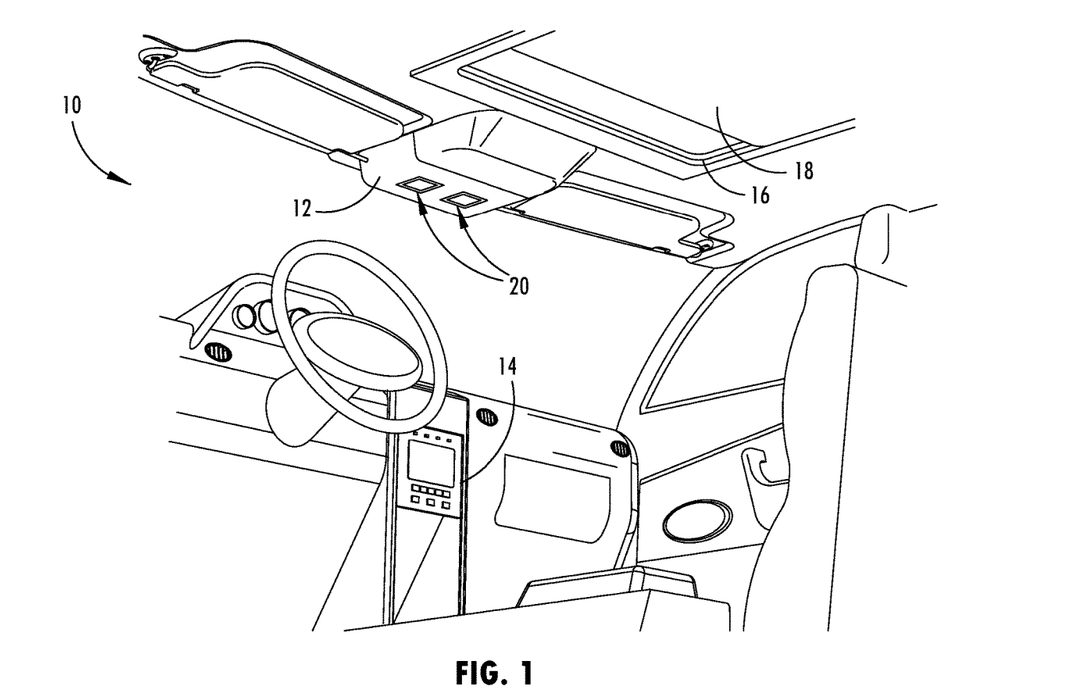
FIG. 1 is a perspective view of a passenger compartment of an automotive vehicle having an overhead console employing a pair of lamp assemblies having proximity switches, according to one embodiment.
Figure 2:
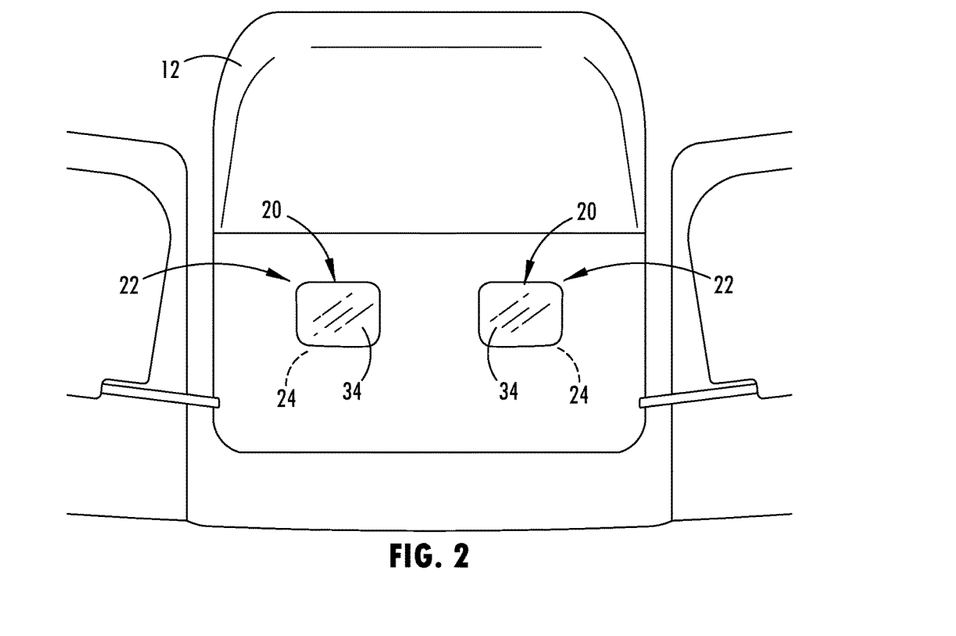
FIG. 2 is an enlarged view of the overhead console further illustrating the lamp assemblies shown in FIG. 1.

Referring to FIGS. 1 and 2, the interior passenger compartment of an automotive vehicle 10 is generally illustrated having a pair of lamp assemblies 20, each configured to include a proximity switch 22 and assembled in an overhead console 12, according to one embodiment. The vehicle 10 shown generally includes the overhead console 12 assembled to the headliner on the underside of the roof or ceiling at the top of the vehicle passenger compartment, generally above the front passenger seating area. Each of the pair of lamp assemblies 20 provides an integral assembly of a lamp and a proximity switch 22 for activating a light source to turn the lamp on and off. Each lamp assembly 20 includes a lens 32 having a light transparent window, a light source disposed behind the lens 32 to illuminate light through the transparent window of the lens 32, and a proximity switch 22 having one or more proximity sensors 24 disposed proximate or near a perimeter of the transparent window of the lens 32 and generating an activation field proximate to the transparent field of the lens 32 to sense activation of the proximity switch 22 to control activation of the light source. In the embodiment shown, the proximity switch 22 is integrally assembled as part of the lamp assembly 20 in which the central portion, including the transparent window, of the lens 32 serves as a touch or sensing pad. The user may contact the sensing pad or come into close proximity therewith to be detected by the activation field. However, it should be appreciated that the proximity switch 22 may be assembled separate from the lamp assembly 20 and employ its own sensing pad and may control any of a number of devices or functions.

A user may activate the light source by activating the proximity switch 22 integrally provided with the lamp assembly 20. The lamp may serve as an interior map or reading lamp to provide interior lighting to the vehicle 10, according to one embodiment. The lamp assembly 20 may also serve as a dome lamp to provide lighting in the interior of the vehicle 10. It should be appreciated that the lamp may serve to provide lighting to the interior of the vehicle for other uses and the lamp assembly 20 may be located elsewhere on the vehicle 10. For example, the lamp assembly 20 may be located in the headliner, a visor, a grab handle, a center console, or elsewhere on the vehicle 10.

Each proximity switch 22 provided in each lamp assembly 20 is shown and described herein as a capacitive switch, according to one embodiment. Each proximity switch 22 includes a proximity sensor 24 that provides a sense activation field to sense contact or close proximity of an object, such as a user's finger, in close relation to the proximity sensor, such as a tap or swiping motion by a user's finger. Thus, the sense activation field generated by the proximity sensor of each proximity switch is a capacitive field in the exemplary embodiment, and the user's finger has electrical conductivity and dielectric properties that cause a change or disturbance in the sense activation field which is detected in a signal generated from the activation field as should be evident to those skilled in the art. However, it should also be appreciated by those skilled in the art that additional or alternative types of proximity sensors can be used, such as, but not limited to, inductive sensors. Exemplary proximity sensors are described in the Apr. 9, 2009, ATMEL® Touch Sensors Design Guide, 10620 D-AT42-04/09, the entire reference hereby being incorporated herein by reference.

The proximity switches may be configured to control other devices. For example, proximity switches 22 may control any of a number of vehicle devices and functions, such as controlling movement of a sunroof or moonroof 16, controlling movement of a moonroof shade 18, controlling activation of one or more lighting devices, and controlling various other devices and functions. While the lamp assemblies 20 with proximity switches 22 are shown located in an overhead console 12, it should be appreciated that the assemblies 20 and proximity switches 22 may be located elsewhere on the vehicle 10, such as in the dash panel, on other consoles such as a center console, integrated into a touch screen display for a radio or infotainment system such as a navigation and/or audio display, or located elsewhere onboard the vehicle 10 according to various vehicle applications.

The proximity switches 22 are shown and described herein as capacitive switches, according to one embodiment. Each proximity switch 22 includes one or more proximity sensors 24 that provide a sense activation field to sense contact or close proximity of a user in close relation to the one or more proximity sensors 24, such as a tap or swiping motion by a user's finger. Thus, the sense activation field of each proximity switch 22 is a capacitive field in the exemplary embodiment and the user's finger has electrical conductivity and dielectric properties that cause a change or disturbance in the sense activation field as should be evident to those skilled in the art. A signal may be generated based on the activation field and processed to detect a user interaction.

Figure 4:
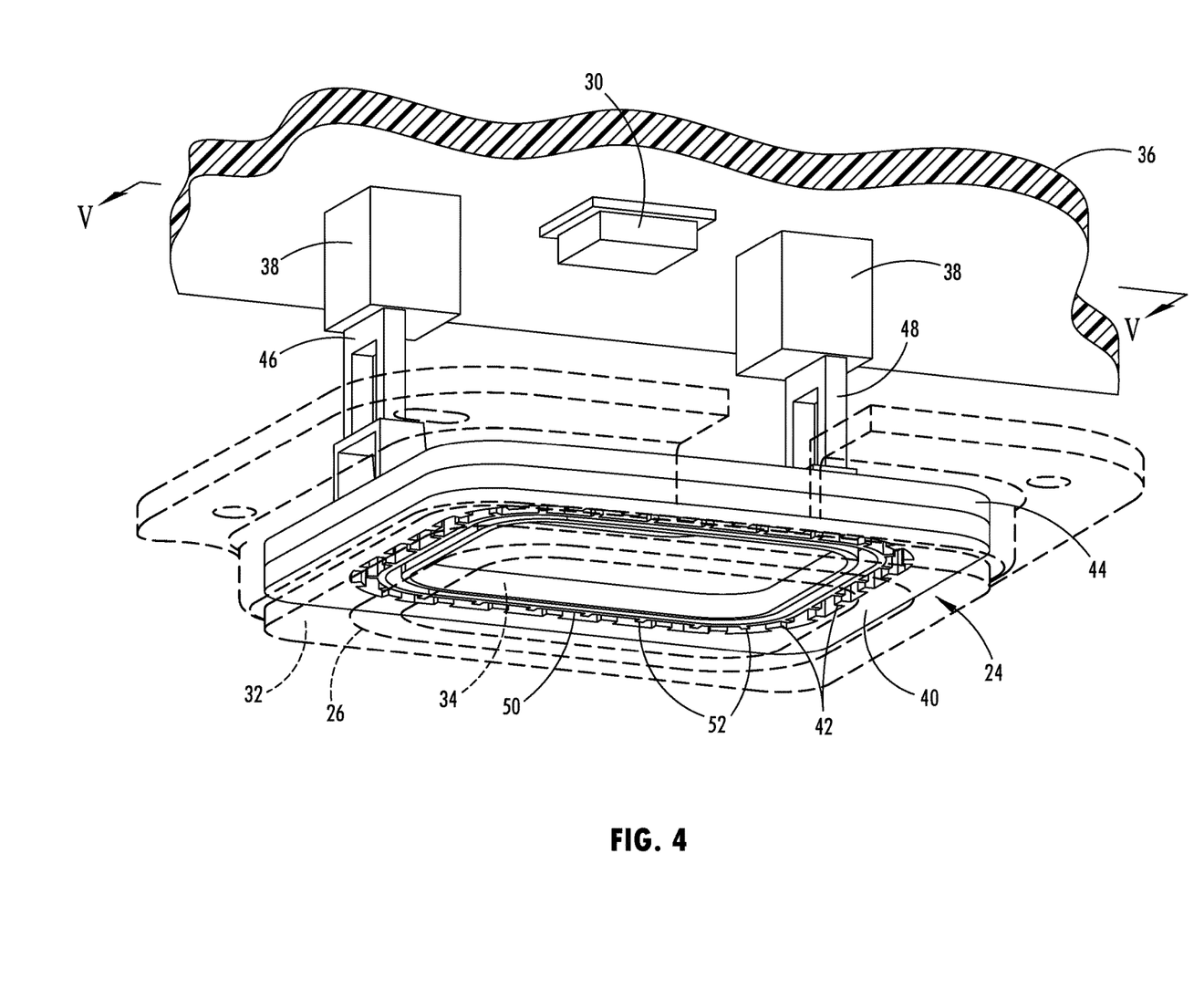
FIG. 4 is a side elevational view of the lamp assembly and the corresponding proximity switch.
Figure 5:
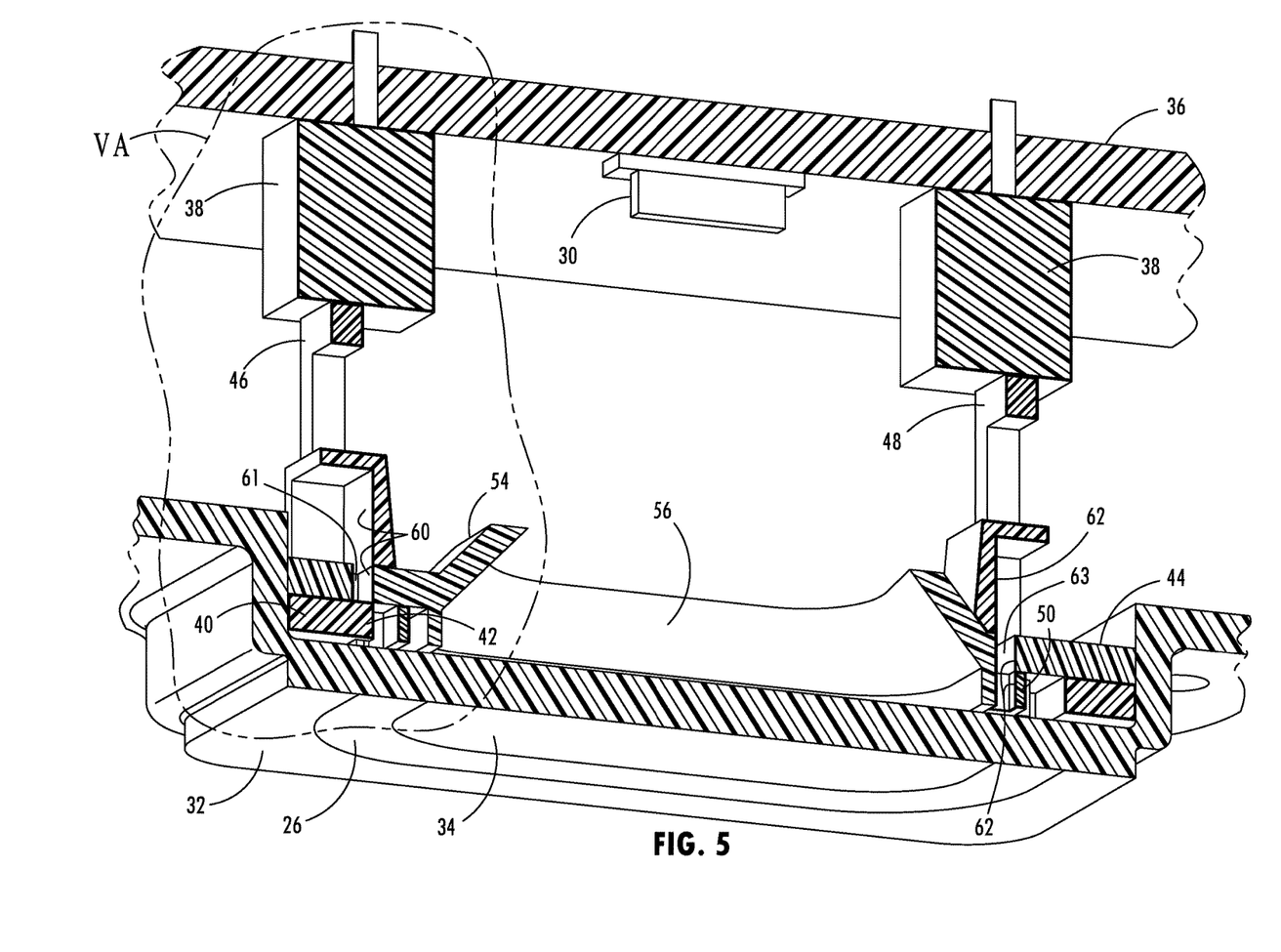
FIG. 5 is a cross-sectional view taken through line V-V of FIG. 4 illustrating the lamp and switch assembly.
Figure 6:
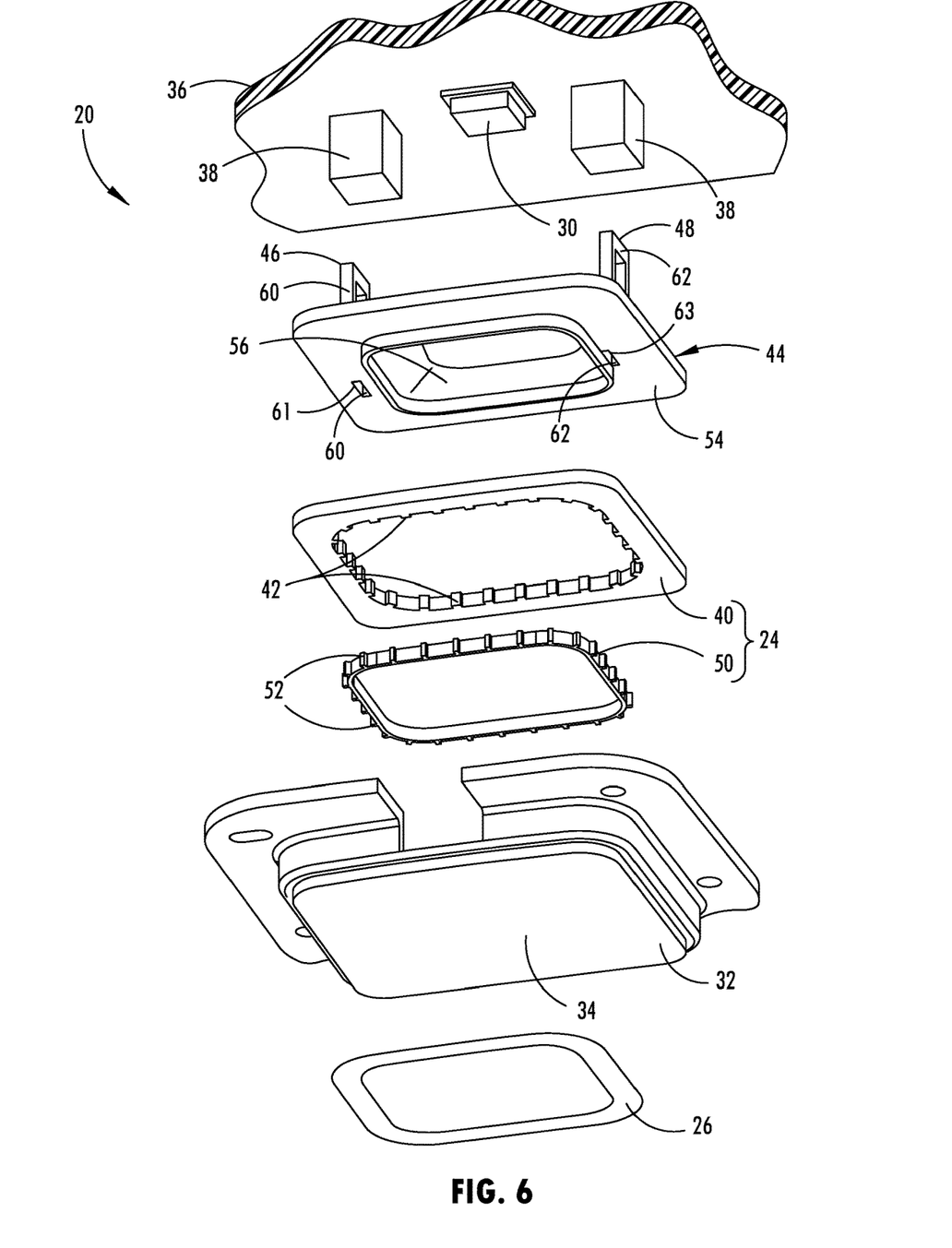
FIG. 6 is an exploded view of the lamp assembly and the corresponding proximity switch.

Referring to FIGS. 4-6, the lamp assembly 20 is generally illustrated having a lens 32 made of a transparent material on the front side. The lens 32 may be integrally molded as part of the overhead console 12. The transparent window 34 of the lens 32 is light transmissive to allow visible light waves to pass through the transparent window 34. A lamp or light source 30 is disposed rearward of the transparent window 34 of the lens 32 to illuminate light forward through the transparent window 34 of the lens 32. The light source 30 may include a light emitting diode (LED) mounted to a circuit board 36, according to one embodiment. Other light sources such as an incandescent bulb or combination of one or more light sources may be employed, according to other embodiments. The lens 32 may be integrally formed as part of the overhead console 12 and having the transparent window 34 formed therein, according to one embodiment. In this embodiment, the transparent window 34 may be molded as part of or into a polymeric material forming the overhead console 12. According to other embodiments, the lens 32 may be formed as a separate component and assembled to the overhead console 12 as shown. In such embodiments, the lens 32 may be fixedly mounted to the overhead console 12 via fasteners, adhesive or other mounting connection and generally does not move relative to the overhead console 12.

The lamp assembly 20 includes a proximity switch 22 having a proximity sensor 24 disposed proximate or near a perimeter of and substantially surrounding the central transparent window 34 forming the sensing pad of the lens 32. The proximity switch 22 has the proximity sensor 24 for generating an activation field 26 proximate to the sensing pad formed by the lens 32 to sense user activation of the proximity switch 22 to control activation of the light source 30, according to one embodiment. In the embodiment shown, the proximity switch 22 has a single proximity sensor 24 configured to extend substantially on all four sides of the lens 32 to substantially surround the transparent window 34 of the lens 32. In this embodiment, the proximity switch 22 substantially surrounds the lens 32 to generate an activation field 26 generally across substantially the entire bottom surface of the lens 32 defining the sensing pad and below the lens 32.

According to one embodiment, the proximity sensor 24 is formed of an electrically conductive metal material that may also serve as a decorative metal trim component. The decorative conductive metal may be plated onto a plastic reflector housing 44 in the upper side of the overhead console 12 about the perimeter of the lens 32. The conductive metal forms a pair of electrodes 40 and 50 that serve to provide a capacitance which produces the activation field 26. It should be appreciated that other forms of capacitive sensors may be employed to generate the activation field 26. It should be appreciated that the activation field 26 generated by the proximity sensor 24 extends below the transparent window of the lens 32 to enable an object, such as a user's finger 28, hand or other body part to enter the activation field 26 at the sensing pad to activate the light source 32 on and off. When an object, such as finger sufficiently engages the activation field below the sensing pad, e.g., lens 32, a disturbance in the activation field is detected such that activation of the proximity switch 22 is initiated so as to either switch the light source 30 on or switch the light source 30 off.

Referring to FIGS. 3-6, the electrode configuration of the proximity sensor 24 is illustrated, according to one embodiment. Sensor 24 includes an outer electrode 40 having inward extending plates or fingers 42, and an inner electrode 50 having outward extending plates or fingers 52. Electrode fingers 42 are interdigitated with electrode fingers 52 to provide a capacitive coupling between the outer electrode 40 and inner electrode 50. The capacitive coupling produces the activation field 26.

Figure 3:
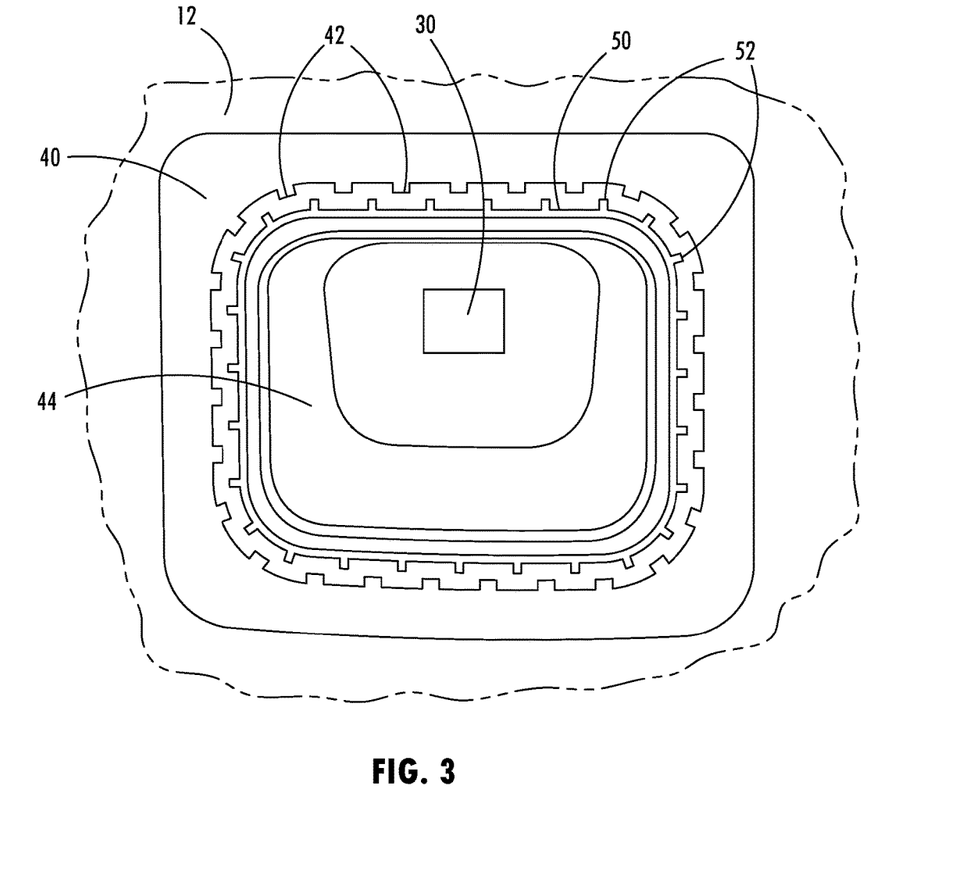
FIG. 3 is an enlarged top view of one lamp assembly and a proximity switch formed thereon with the front lens removed, according to one embodiment.
Figure 3A:
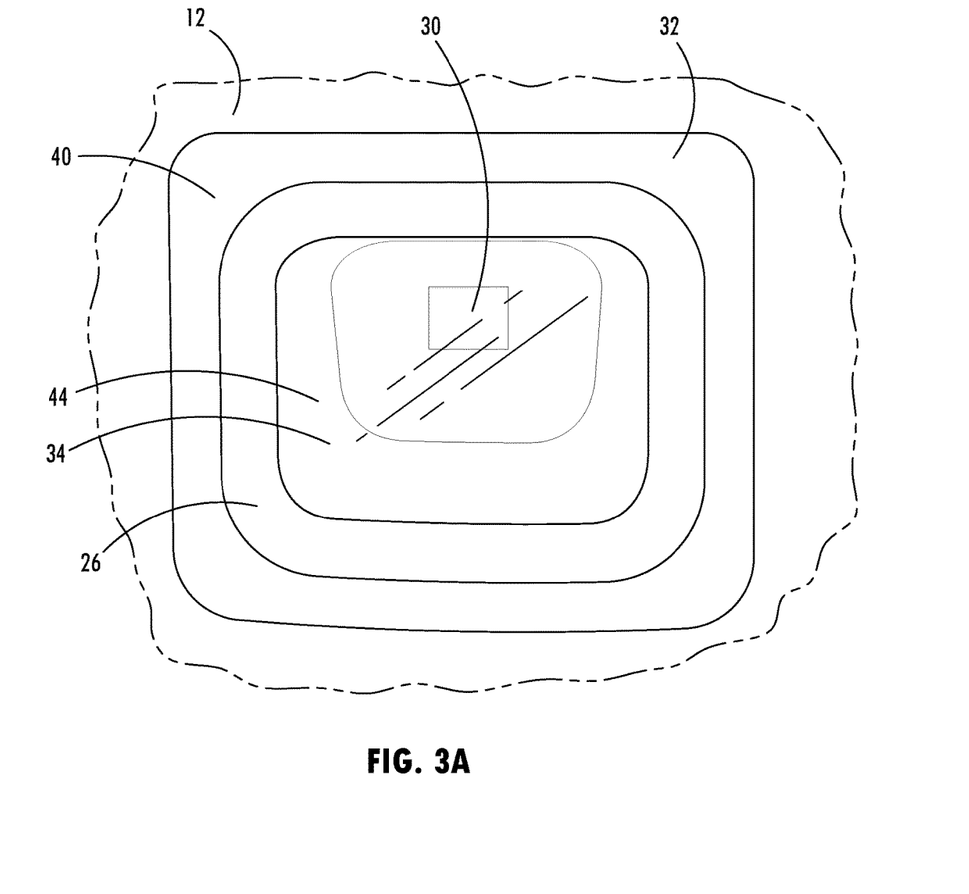
FIG. 3A is an enlarged top view of the lamp assembly and proximity switch of FIG. 3 with the opaque layer and lens assembled.

The outer electrode 40 is coupled to a first plated signal line 60, while the inner electrode 50 is coupled to a second plated signal line 62. The first and second plated signal lines 60 and 62 electrically connect to circuitry on the circuit board 36. A pulsed drive input signal (e.g., voltage) is applied to one of the signal lines 60 and 62, and an output voltage proportional to the capacitance is received on the other of the signal lines 60 and 62. The input voltage provides a charge coupling on one of the outer and inner electrodes 40 and 50, while the other of the outer and inner electrodes 40 and 50 provides a signal indicative of the capacitive coupling between the outer and inner electrodes 40 and 50. The output signal and the input signal may be processed by control circuitry, such as a controller, to determine whether an object, such as a user's finger, is sufficiently interacting with the activation field 26 to activate the proximity switch 22.

The electrically conductive material forming the proximity sensor 34, particularly the electrodes 40 and 50, is also used to form a decorative metal trim component that is visible on the front side of the proximity switch 24 and lamp assembly 20. The visible portion of the proximity sensor 24 which is exposed as the decorative metal trim component is shown in FIG. 2 as a ring or bezel generally surrounding the central transparent region 34 of the sensing pad of lens 32. The portion of the proximity sensor 24 that is visible as a decorative metal trim component from the front side is a portion of the outer electrode 40. The outer electrode 40 as well as the inner electrode 50 are made of a decorative metal, such as chrome or aluminum that may serve as a shiny decorative trim component. The assembly set forth in the present disclosure advantageously incorporates the decorative conductive material as both a trim component piece and an electrode in an integrated manner.

In the embodiment shown, only a portion of the proximity sensor 24, particularly only a portion of the outer electrode 40, is visible from the front side of the lamp assembly 20. This is because an opaque layer 26 is disposed on the lens 32 to mask or block viewing of other portions or components of the proximity sensor 24. In the example shown in FIGS. 3A and 6, the opaque layer 26 is shown as a ring positioned directly forward or in front of the inner electrode 50 and the fingers 42 of outer electrode 40. As a result, only the main outer ring of outer electrode 40 is visible as the decorative metal trim component from the front side surrounding the sensing pad of the proximity switch assembly 20. It should be appreciated that the opaque layer 26 may otherwise be configured to allow for viewing of other portions of the proximity sensor 24. It should further be appreciated that the opaque layer 26 may not exist such that the entire proximity sensor including the electrodes 40 and 50 that are made of the decorative metal may be viewable from the front side of the assembly, according to other embodiments.

Figure 5A:
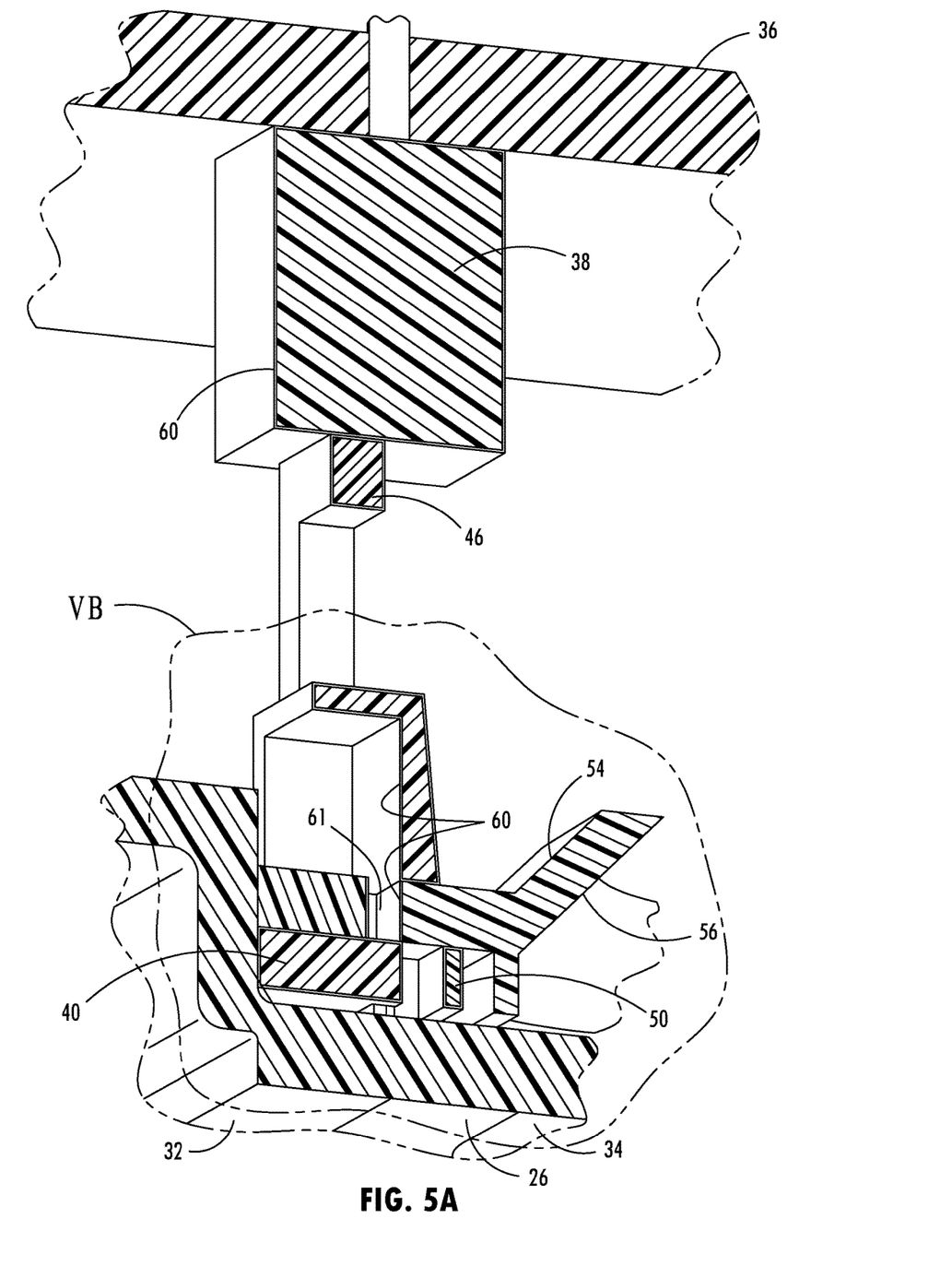
FIG. 5A is an enlarged view of section VA of FIG. 5.
Figure 5B:
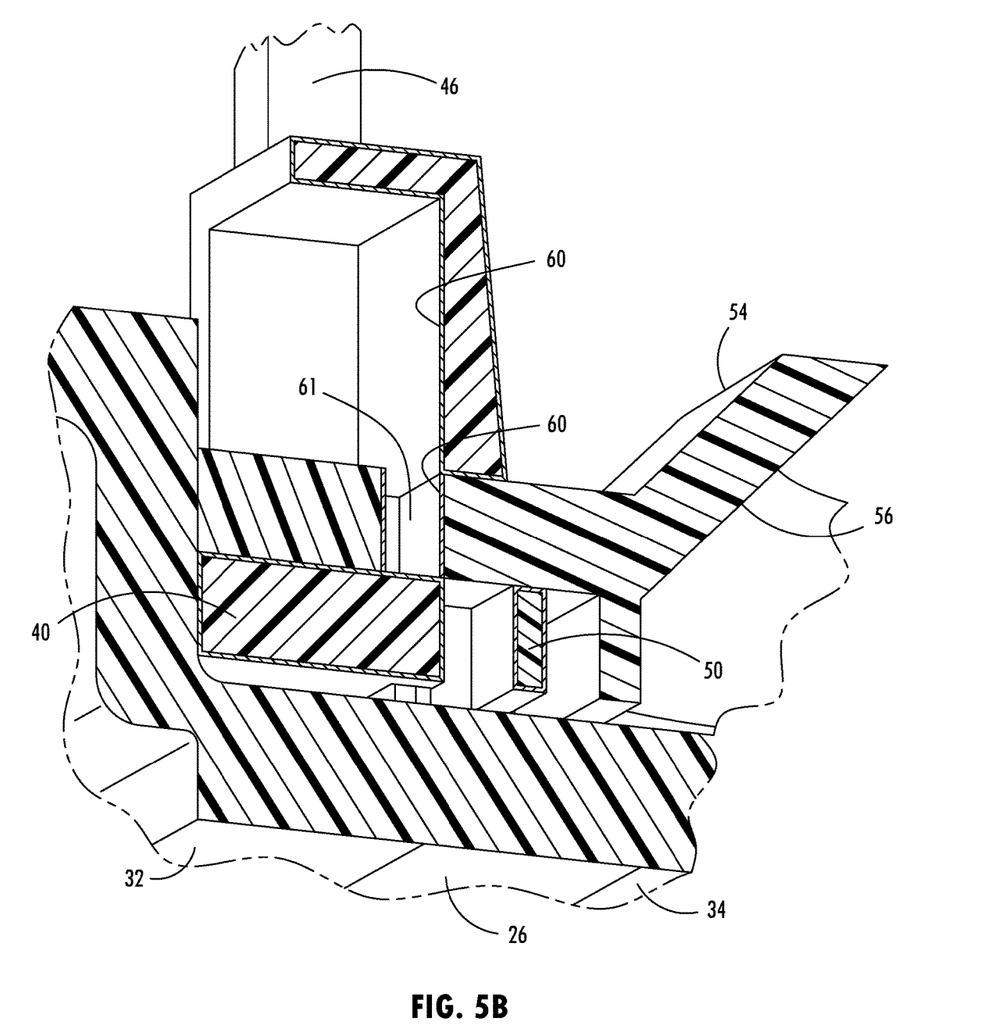
FIG. 5B is an enlarged view of section VB-VB of FIG. 5.

According to one embodiment, the electrically conductive material forming the electrodes 40 and 50 and the first and second plated signal lines 60 and 62 may be formed of a chrome that is plated onto a thermoplastic or plastic polymer such as a polycarbonate (PC) or acrylonitrile butadiene styrene (ABS) material. The electrodes 40 and 50 and the plated signal lines 60 and 62 may all be formed on the reflector housing 44 in a single electroplating process. The process may include a vacuum metallization process, according to one embodiment. The electrodes 40 and 50 are formed on the front surface 54 of the reflector housing 44. The reflector housing 44 may have a front reflective surface 56 for reflecting light forward. The plated signal lines 60 and 62 may be formed extending from contact with one of the electrodes 40 and 50, respectively, via plated holes 61 and 63 and extending through legs or towers 46 or 48 of the reflector housing 44 and into contact with connectors 38 on the circuit board 36. As such, electrically conductive signal lines are formed connecting one of the electrodes 40 or 42 to one of the towers 46 and 48. Towers 46 and 48, in turn, electrically connect to the circuit board 36 through the connectors 38. As such, control circuitry on the circuit board 36 may provide an electrical signal to one of the electrodes 40 and 42 and may receive a signal from the other of the electrodes 40 and 42 and process the signal to determine activation of the switch. The electrical signal path provided by the plated signal lines 60 and 62 is illustrated in more detail in FIGS. 5-5B, according to one example. As shown, the chrome plating forms an electrically conductive signal path extending from each of the electrodes 40 and 50 to the circuit board 36. The underlying polymeric material is a dielectric and is electrically insulated. It should be appreciated that other shapes and sizes and techniques may be employed for providing a signal path extending from the electrodes 40 and 50 to the control circuitry on the circuit board 36. It should further be appreciated that the plated electrical circuitry may be formed using a coring technique in which an area of polymeric material is cored out and plated to provide an electrical signal path therethrough.

According to one embodiment, the electrically conductive material forming the proximity sensor 24 and decorative metal trim component is chrome, which may be chrome plated onto a polymeric material. However, it should be appreciated that the decorative material may include other materials that have a shiny metal appearance and are electrically conductive including aluminum.

Figure 7:
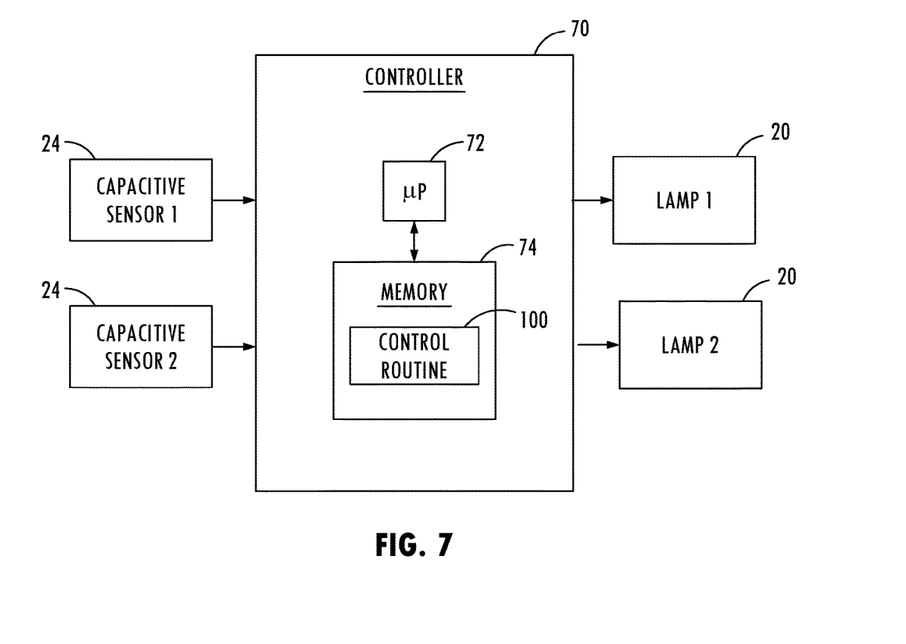
FIG. 7 is a block diagram illustrating a controller for controlling the lamp assembly based on the proximity switch inputs, according to one embodiment.

The proximity switch 20 may include control circuitry as shown in FIG. 7, according to one embodiment. Included is a controller 70 having a microprocessor 72 and memory 74. The controller 70 may execute one or more control routines 100 as is known in the art via the processor 72 to process capacitor sensor inputs from capacitive sensors 24 and control corresponding devices shown as lamp 1 and lamp 2, each labeled lamp 20. The controller 70 may process the capacitive signals sensed by each of the sensors 24 and compare the sensor values to thresholds to determine activation of the corresponding switch 22 indicative of activating one or more control devices, such as one of the lamps 20.

Figure 8:
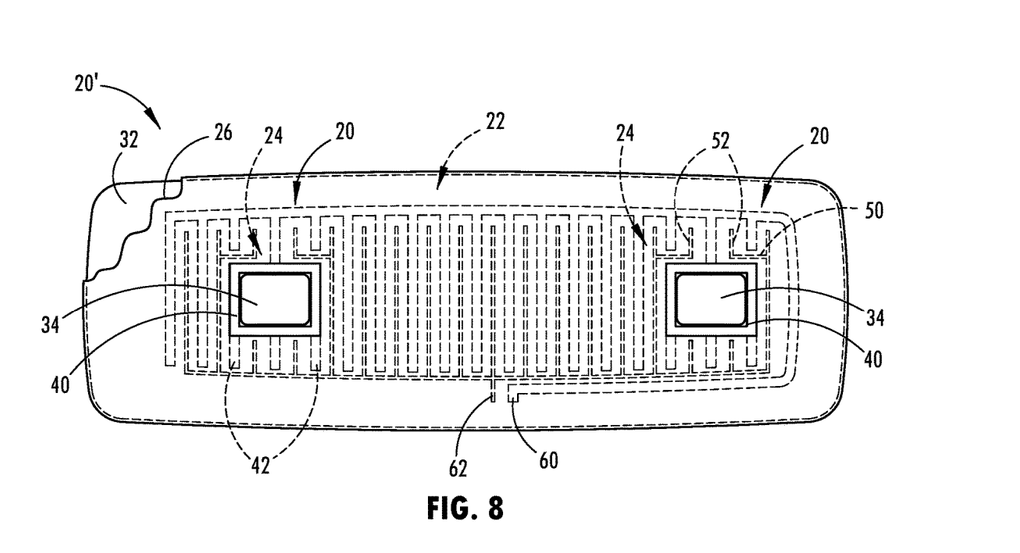
FIG. 8 is a perspective view of an overhead console with lamp and proximity switch assemblies, according to another embodiment.

Referring to FIG. 8, a lamp and switch assembly 20' is illustrated having the proximity switch 22 and capacitive sensor 24 configured in an alternative configuration, according to a second embodiment. In this embodiment. In this embodiment, a pair of lamp assemblies 20' is configured with a proximity switch 22 to turn the lamps on and off. The proximity switch 22 is shown as a capacitive switch having a capacitive sensor 24 with a pair of electrodes 40 and 50 and corresponding interdigitated electrode fingers 42 and 52. A portion of one electrode is shown surrounding each of the transparent windows 34 of lens 32 so as to form a decorative trim component shown in the shape of a ring surrounding the transparent window 34. The decorative trim component is a portion of one of the electrodes that is not covered by the opaque layer 26 that covers the remainder of lens 32. As such, the conductive decorative material e.g., chrome, forming the electrode that is viewable in the unmasked area not covered by opaque layer 26 also serves as the electrode material for forming one of the electrodes of the proximity sensor. It should be appreciated that the opaque layer 26 may cover more or less portions of the proximity sensor 24, according to other embodiments.

Accordingly, the present proximity switch advantageously integrates a decorative feature of a conductive material with a proximity sensor, specifically a capacitive sensor, to form a proximity switch. The proximity switch advantageously employs a single conductive material to both form an electrically conductive sensing component and decorative trim component and thereby eliminates the need for a separate metal trim part which may otherwise interfere with the sensing ability of the proximity sensor and switch. In addition, the proximity sensor may have fewer components for assembly.

It is to be understood that variations and modifications can be made on the aforementioned structure without departing from the concepts of the present invention, and further it is to be understood that such concepts are intended to be covered by the following claims unless these claims by their language expressly state otherwise.

What is claimed is:

1. A proximity switch assembly for a vehicle, comprising:
a sensing pad;
a proximity sensor proximate the sensing pad for generating an activation field, wherein the proximity sensor comprises at least one electrode that is viewable by a user on a front side and that forms a decorative trim component, wherein the proximity sensor comprises a first electrode comprising a first plurality of electrode fingers and a second electrode comprising a second plurality of electrode fingers, wherein the first and second electrode fingers are interdigitated and electrically coupled to generate the activation field, and wherein the second electrode surrounds the first electrode;
an opaque portion covering a portion of the at least one electrode so as to expose a portion of the decorative trim component; and
a control circuitry for determining activation of the proximity switch based on a signal generated from the activation field.

2. The proximity switch assembly of claim 1, wherein the proximity sensor further comprises a capacitive sensor.

3. The proximity switch assembly of claim 1, wherein the proximity switch assembly is employed on the vehicle.

4. The proximity switch assembly of claim 3, wherein the proximity switch assembly is provided on a vehicle lamp.

5. The proximity switch assembly of claim 4, wherein the sensing pad comprises a lens.

6. The proximity switch assembly of claim 1, wherein the proximity sensor further comprises chrome.

7. The proximity switch assembly of claim 6, wherein the chrome forms an electrical circuit for transmitting signals for the proximity sensor.

8. A proximity switch assembly for a vehicle, comprising:
a sensing pad;
a capacitive sensor extending around the sensing pad for generating an activation field, wherein the capacitive sensor comprises at least one electrode that is viewable by a user on a front side and also forms a decorative trim component, wherein the capacitive sensor comprises a first electrode comprising a first plurality of electrode fingers and a second electrode comprising a second plurality of electrode fingers, wherein the first and second electrode fingers are interdiqitated and electrically coupled to generate the activation field, and wherein the second electrode substantially surrounds the first electrode;
an opaque portion covering a portion of the at least one electrode so as to expose a portion of the decorative trim component; and
a control circuitry for determining activation of the proximity switch based on a signal generated from the activation field.

9. The proximity switch assembly of claim 8, wherein the proximity switch assembly is employed on the vehicle.

10. The proximity switch assembly of claim 9, wherein the proximity switch assembly is provided on a vehicle lamp.

11. The proximity switch assembly of claim 8, wherein the capacitive sensor further comprises chrome.

12. The proximity switch assembly of claim 11, wherein the chrome forms an electrical circuit for transmitting signals for the capacitive sensor.

13. A vehicle proximity switch assembly comprising:
a sensing pad;

a capacitive sensor extending around the sensing pad for generating an activation field, wherein the capacitive sensor comprises at least one electrode that is viewable by a user on a front side and also forms a decorative trim component, wherein the capacitive sensor comprises a first electrode comprising a first plurality of electrode fingers and a second electrode comprising a second plurality of electrode fingers, wherein the first and second electrode fingers are interdigitated and electrically coupled to generate the activation field, and wherein the second electrode substantially surrounds the first electrode;

an opaque layer covering only a portion of the capacitive sensor so as to expose the trim component; and a control circuitry for determining activation of the proximity switch based on a signal generated from the activation field.

* * * * *

UNITED STATES PATENT AND TRADEMARK OFFICE
CERTIFICATE OF CORRECTION

PATENT NO. : 10,454,474 B2  
APPLICATION NO. : 15/598773  
DATED : October 22, 2019  
INVENTOR(S) : Majkowski et al.

Page 1 of 1

It is certified that error appears in the above-identified patent and that said Letters Patent is hereby corrected as shown below:

In the Claims

Column 8;  
Claim 1, Line 21:  
After "switch" insert --assembly--.  
Claim 8, Line 54:  
After "switch" insert --assembly--.

Column 9;  
Claim 13, Line 16:  
After "switch" insert --assembly--.

Signed and Sealed this  
Thirty-first Day of December, 2019

Andrei Iancu  
*Director of the United States Patent and Trademark Office*